(12) United States Patent
Kim et al.

(10) Patent No.: US 11,510,309 B2
(45) Date of Patent: Nov. 22, 2022

(54) DISPLAY DEVICE

(71) Applicant: Samsung Display Co., Ltd., Yongin-si (KR)

(72) Inventors: Wontae Kim, Hwaseong-si (KR); Jae-Han Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 17/240,888

(22) Filed: Apr. 26, 2021

(65) Prior Publication Data

US 2022/0046784 A1 Feb. 10, 2022

(30) Foreign Application Priority Data

Aug. 6, 2020 (KR) .................. 10-2020-0098782

(51) Int. Cl.
| | | |
|---|---|---|
| *H05K 1/02* | (2006.01) | |
| *H05K 1/14* | (2006.01) | |
| *H05K 1/18* | (2006.01) | |
| *H01L 25/18* | (2006.01) | |
| *G06F 3/041* | (2006.01) | |

(52) U.S. Cl.
CPC .......... *H05K 1/0204* (2013.01); *H05K 1/147* (2013.01); *H05K 1/181* (2013.01); *H05K 1/189* (2013.01); *G06F 3/0412* (2013.01); *H01L 25/18* (2013.01); *H05K 2201/066* (2013.01); *H05K 2201/10128* (2013.01)

(58) Field of Classification Search
CPC ...... H05K 1/0204; H05K 1/147; H05K 1/189; H05K 2201/066; H05K 2201/10128
See application file for complete search history.

(56) References Cited

U.S. PATENT DOCUMENTS

| | | | |
|---|---|---|---|
| 7,115,980 B2 | 10/2006 | Miyagawa et al. | |
| 10,446,465 B2 | 10/2019 | Kim et al. | |
| 2014/0355214 A1 | 12/2014 | Tamai et al. | |
| 2017/0123459 A1* | 5/2017 | Song | G06F 1/1652 |
| 2017/0135213 A1* | 5/2017 | Lee | H05K 1/111 |
| 2018/0158750 A1* | 6/2018 | Kim | H01L 23/36 |
| 2019/0102027 A1* | 4/2019 | Yoo | G06F 3/0445 |
| 2020/0077518 A1 | 3/2020 | Kim et al. | |

FOREIGN PATENT DOCUMENTS

| | | |
|---|---|---|
| JP | 3549760 B2 | 8/2004 |
| JP | 4251129 B2 | 4/2009 |
| JP | 2014-232221 A | 12/2014 |
| KR | 10-2020-0026369 A | 3/2020 |

* cited by examiner

*Primary Examiner* — Sherman Ng
(74) *Attorney, Agent, or Firm* — Lewis Roca Rothgerber Christie LLP

(57) ABSTRACT

Provided is a display device including a display panel including a plurality of first pads, and a plurality of second pads spaced apart from the first pads, a first circuit board including first circuit pads respectively bonded to the first pads, a first driving chip electrically connected to the first circuit pads, and a first heat radiation member, and a second circuit board including second circuit pads respectively bonded to the second pads, and a second driving chip electrically connected to the second circuit pads, wherein the first heat radiation member overlaps the first driving chip and the second driving chip.

20 Claims, 10 Drawing Sheets

DISPLAY DEVICE

CROSS-REFERENCE TO RELATED APPLICATION

This application claims priority to and the benefit of Korean Patent Application No. 10-2020-0098782, filed on Aug. 6, 2020, in the Korean Intellectual Property Office, the entire contents of which are hereby incorporated by reference.

BACKGROUND

1. Field

The present disclosure herein relates to a display device including two kinds of circuit boards overlapping each other.

2. Description of Related Art

In general, a display panel is manufactured, and then a circuit board is connected to the display panel. For example, a tape automated bonding (TAB) mounting method allows the circuit board to be bonded to the display panel by using an anisotropic conductive film (ACF).

One end of the circuit board is bonded to the display panel, and driving signals necessary for driving the display panel are transmitted to the display panel through the one end of the circuit board. Also, image signals may be provided to the display panel through a driving chip mounted on the circuit board.

In recent years, a plurality of circuit boards are bonded to the display panel in accordance with the trend of enlargement of the display panel. Also, a heat radiation member that radiates heat generated from the driving chip mounted to each of the circuit boards to the outside may be mounted on the circuit board.

SUMMARY

The present disclosure provides a display device including a heat radiation member capable of dissipating heat generated from two circuit boards overlapping each other.

Some embodiments of the present disclosure provide a display device including a display panel including a plurality of first pads, and a plurality of second pads spaced apart from the first pads, a first circuit board including first circuit pads respectively bonded to the first pads, a first driving chip electrically connected to the first circuit pads, and a first heat radiation member, and a second circuit board including second circuit pads respectively bonded to the second pads, and a second driving chip electrically connected to the second circuit pads, wherein the first heat radiation member overlaps the first driving chip and the second driving chip.

The first driving chip and the first heat radiation member may be on different layers, wherein the second driving chip directly faces the first heat radiation member.

The first heat radiation member may entirely overlap the first driving chip and the second driving chip in a plan view, wherein the second driving chip contacts the first heat radiation member.

The second circuit board may further include a second heat radiation member at a layer that is different from the second driving chip, and entirely overlapping the second driving chip.

The second driving chip may be between the first heat radiation member and the second heat radiation member.

The first heat radiation member may have a planar area that is greater than that of the second heat radiation member, wherein the second heat radiation member entirely overlaps the first heat radiation member.

The first circuit board may further include a first substrate having a first bottom surface facing the display panel, and a first top surface opposite to the first bottom surface, wherein the first circuit pads and the first driving chip are on the first bottom surface, and wherein the first heat radiation member is on the first top surface.

The second circuit board may further include a second substrate having a second bottom surface facing the first circuit board, and a second top surface opposite to the second bottom surface, wherein the second circuit pads and the second driving chip are on the second bottom surface.

The second circuit board may further include a second heat radiation member that overlaps the second driving chip, and that is on the second top surface, wherein the second driving chip is between the first heat radiation member and the second heat radiation member.

The first heat radiation member may define at least one opening that does not overlap the first driving chip or the second driving chip.

The first driving chip may be spaced apart from the second driving chip in one direction in a plan view, wherein the at least one opening is of a plurality of openings that are arranged in a different direction that is perpendicular to the one direction, and wherein the first heat radiation member is bent with respect to the different direction in an area in which the openings are defined.

The opening may be defined between the first driving chip and the second driving chip in a plan view.

The first pads may be arranged in a first row, wherein the second pads are arranged in a second row spaced apart from the first row in one direction.

The first circuit board and the second circuit board may be bent from one end of the display panel, wherein the first circuit board and the second circuit board have one end facing a top surface of the display panel, on which the first pads and the second pads are located, and another end facing a bottom surface of the display panel, which is opposite to the top surface.

The first heat radiation member might not overlap the first circuit pads or the second circuit pads.

In some embodiments of the present disclosure, a display device includes a display panel, a first circuit board including a first base layer having a first bottom surface and a first top surface, a first driving chip that is electrically connected to the display panel and is on the first bottom surface, and a first heat radiation member that entirely overlaps the first driving chip and is on the first top surface, and a second circuit board including a second base layer having a second top surface and a second bottom surface that faces the first heat radiation member, a second driving chip that is electrically connected to the display panel and is between the first heat radiation member and the second bottom surface, and a second heat radiation member that entirely overlaps the second driving chip and is on the second top surface.

The first heat radiation member may have a planar area that is greater than that of the second heat radiation member, wherein the first driving chip, the second driving chip, and the second heat radiation member entirely overlap the first heat radiation member.

The first circuit board may be defined by a first portion facing a top surface of the display panel, a second portion facing a bottom surface of the display panel, and a third portion between the first portion and the second portion, wherein the first heat radiation member and the first driving chip overlap the third portion.

The second heat radiation member might not overlap the first driving chip.

In some embodiments of the present disclosure, a display device includes a display panel, a first circuit board including a first driving chip, and a heat radiation member that entirely overlaps the first driving chip, and a second circuit board on the first circuit board to cover the first driving chip and the heat radiation member, and including a second driving chip, wherein the heat radiation member is between the first driving chip and the second driving chip, and entirely overlaps the first driving chip and the second driving chip.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1A:
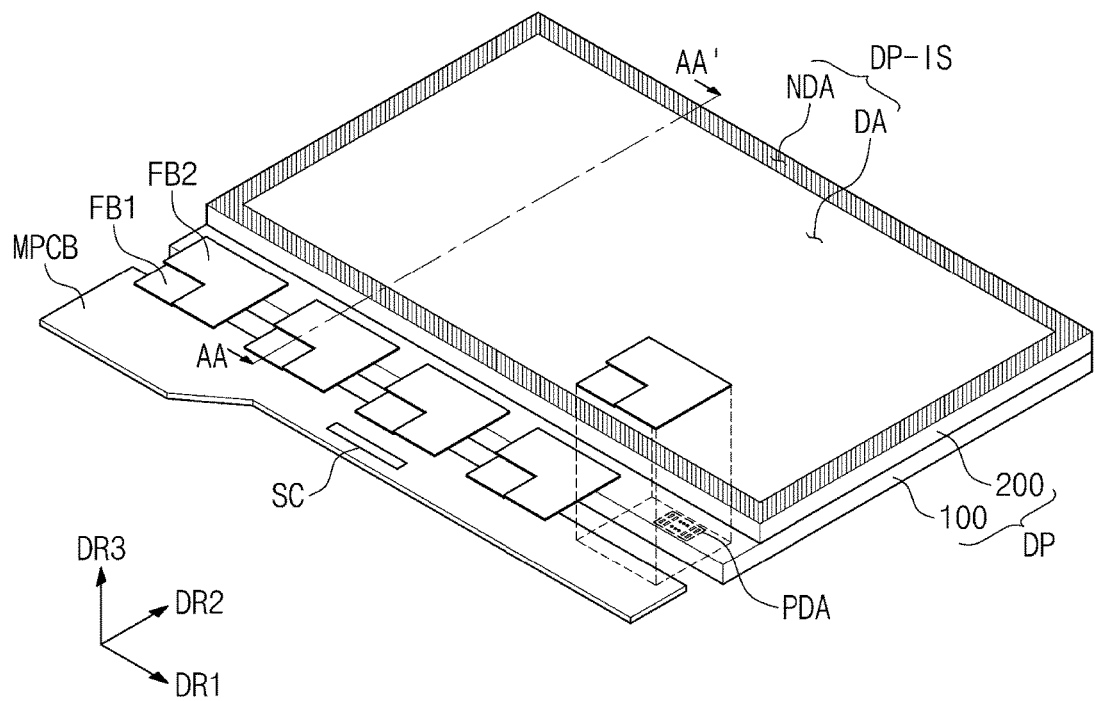
FIG. 1A is a perspective view of a display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
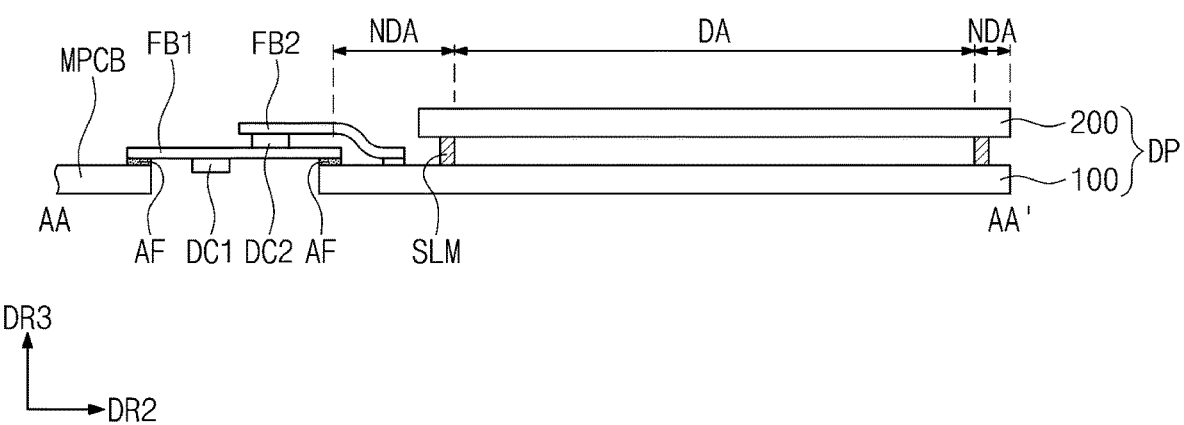
FIG. 1B is a cross-sectional view taken along the line AA-AA' in FIG. 1A according to some embodiments of the present disclosure.

FIG. 1A is a perspective view of a display device according to some embodiments of the present disclosure. FIG. 1B is a cross-sectional view taken along the line AA-AA' of FIG. 1A according to some embodiments of the present disclosure.

In this specification, a display device DD may be applied to large-sized electronic devices, such as televisions and monitors and small and medium-sized electronic devices such as tablet computers, navigation units for vehicles, game consoles, and smart watches. Also, the display device DD according to some embodiments of the present disclosure may be applied to mobile phone terminal. In some embodiments, as electronic modules mounted on a main board, a camera module, and a power module are located on a bracket/case in conjunction with the display device DD, the mobile phone terminal may be constituted.

Referring to FIG. 1A, the display device DD includes a display panel DP, circuit boards FB1 and FB2, and a driving circuit board MPCB.

The display panel DP may include a first display substrate 100, and a second display substrate 200 spaced apart from the first display substrate 100 while facing the same. The first display substrate 100 may include a display element layer and a circuit element layer, which are suitable for generating an image, and the second display substrate 200 may display the image generated from the first display substrate 100.

Although the display panel DP according to some embodiments of the present disclosure may be a light emitting display panel, the present disclosure is not particularly limited to the kind of the display panel DP. For example, the display panel DP may be an organic light emitting display panel or a quantum-dot light emitting display panel. The organic light emitting display panel may include a light emitting layer containing an organic light emitting material. The quantum dot light emitting display panel may include a light emitting layer containing a quantum dot, a quantum rod, etc. Hereinafter, the display panel DP will be described as the organic light emitting display panel. However, the present disclosure is not limited thereto. For example, according to some embodiments, various display panels may be applied to embodiments of the present disclosure.

As illustrated in FIG. 1A, the display device DD may display an image through a display surface DP-IS. The display surface DP-IS is parallel to a plane defined by a first direction DR1 and a second direction DR2. A normal direction of the display surface DD-IS (e.g., a thickness direction of the display device DD) indicates a third direction DR3. In this specification, an expression "when viewed on a plane" or "on a plane" may represent a case when viewed in the third direction DR3. Hereinafter, a front surface (or top surface) and a rear surface (or bottom surface) of each of layers or units are distinguished by the third direction DR3. However, directions indicated by the first to third directions DR1, DR2, and DR3 may be a relative concept and thus converted into a different direction (e.g., an opposite direction).

Also, the display surface DP-IS includes a display area DA on which an image is displayed, and a non-display area NDA located adjacent to the display area DA. The non-display area NDA may be an area on which an image is not displayed. The non-display area NDA may be defined as an edge area of the second display substrate 200, and an area of the first display substrate 100 that does not overlap the second display substrate 200. However, the present disclosure is not limited thereto. For example, the non-display area NDA defined in the second display substrate 200 may be adjacent to one side of the display area DA or omitted.

According to some embodiments of the present disclosure, although the display panel DP providing the flat display surface DP-IS is illustrated, the present disclosure is not limited thereto. The display panel DP may include a curved display surface or a three-dimensional display surface. The three-dimensional display surface may include a plurality of display areas facing in different directions from each other.

The driving circuit board MPCB may include a signal control circuit SC. The signal control circuit SC may receive image data and control signals from an external graphic control unit, and may transmit the received image data and control signals to the display panel DP.

The circuit boards FB1 and FB2 may electrically connect the display panel DP with the driving circuit board MPCB. Each of the circuit boards FB1 and FB2 according to some embodiments of the present disclosure may be a flexible circuit board. Each of the circuit boards FB1 and FB2 may have one end that is electrically bonded on the first display substrate 100 and the other end that is electrically bonded on the driving circuit board MPCB.

According to some embodiments of the present disclosure, the circuit boards FB1 and FB2 may include two kinds of circuit boards overlapping each other. For example, the two kinds of circuit boards FB1 and FB2 may be separated from each other, and provided in plurality. The two kinds of circuit boards FB1 and FB2 may be arranged in the first direction DR1. Although the plurality of two kinds of circuit boards FB1 and FB2 are provided in this specification, the present disclosure is not limited thereto. For example, at least one pair of two kinds of circuit boards FB1 and FB2 electrically connecting the display panel DP and the driving circuit board MPCB may be located therebetween.

The first display substrate 100 defines a plurality of pad areas PDA bonded to the plurality of two kinds of circuit boards FB1 and FB2, respectively. The pad area PDA may be exposed from, or uncovered by, the second display substrate 200, and may overlap the non-display area NDA.

The two kinds of circuit boards FB1 and FB2 may be connected to pads located in a corresponding one of the pad areas PDA. The pads located in the pad area PDA may include first pads and second pads, which are arranged in different rows. Hereinafter, in this specification, it will be described that the first pads are arranged in a first row, and the second pads are arranged in a second row. The first row and the second row may be spaced apart from each other in the second direction DR2, and each of the first pads and the second pads are arranged in the first direction DR1.

The two kinds of circuit boards FB1 and FB2 include a first circuit board FB1 bonded to the first pads arranged in the first row, and a second circuit board FB2 bonded to the second pads arranged in the second row. Here, the second pads arranged in the second row may be closer to the display area DA than the first pads arranged in the first row, and may be spaced (e.g., by a predetermined distance) from the first circuit board FB1.

According to some embodiments of the present disclosure, the second circuit board FB2 may cover at least one portion of the first circuit board FB1. In other words, the second circuit board FB2 may include an area overlapping the first circuit board FB1.

Referring to FIG. 1B, the first circuit board FB1 and the second circuit board FB2 may include a first driving chip DC1 and a second driving chip DC2, each of which is electrically connected to the display panel DP. Each of the first driving chip DC1 and a second driving chip DC2 may receive the image data and the control signal transmitted from the driving circuit board MPCB, and may output image signals to be transmitted to the display panel DP on the basis of the received image data and control signal. The first circuit board FB1 may transmit image signals outputted from the first driving chip DC1 to the first pads arranged in the first row of the display panel DP, respectively. The second circuit board FB2 may transmit image signals outputted from the second driving chip DC2 to the second pads arranged in the second row of the display panel DP, respectively.

Each of the first circuit board FB1 and the second circuit board FB2 may be connected to each of the display panel DP and the driving circuit board MPCB by a conductive adhesive member AF. For example, the conductive adhesive member may be an anisotropic conductive film. However, the present disclosure is not limited thereto. For example, the first circuit board FB1 and the second circuit board FB2 may be bonded to the display panel DP through an ultrasonic bonding process. For example, the circuit pads located on the first circuit board FB1 and the second circuit board FB2 may directly contact the pad located on the display panel DP.

As illustrated in FIG. 1B, a cell cap (e.g., a predetermined cell cap) may be defined between the first display substrate 100 and the second display substrate 200. The cell gap may be maintained by a sealant SLM that couples the first display substrate 100 and the second display substrate 200. For example, the sealant SLM may overlap the non-display area NDA, and may surround the display area DA on a plane/in a plan view.

Figure 2:
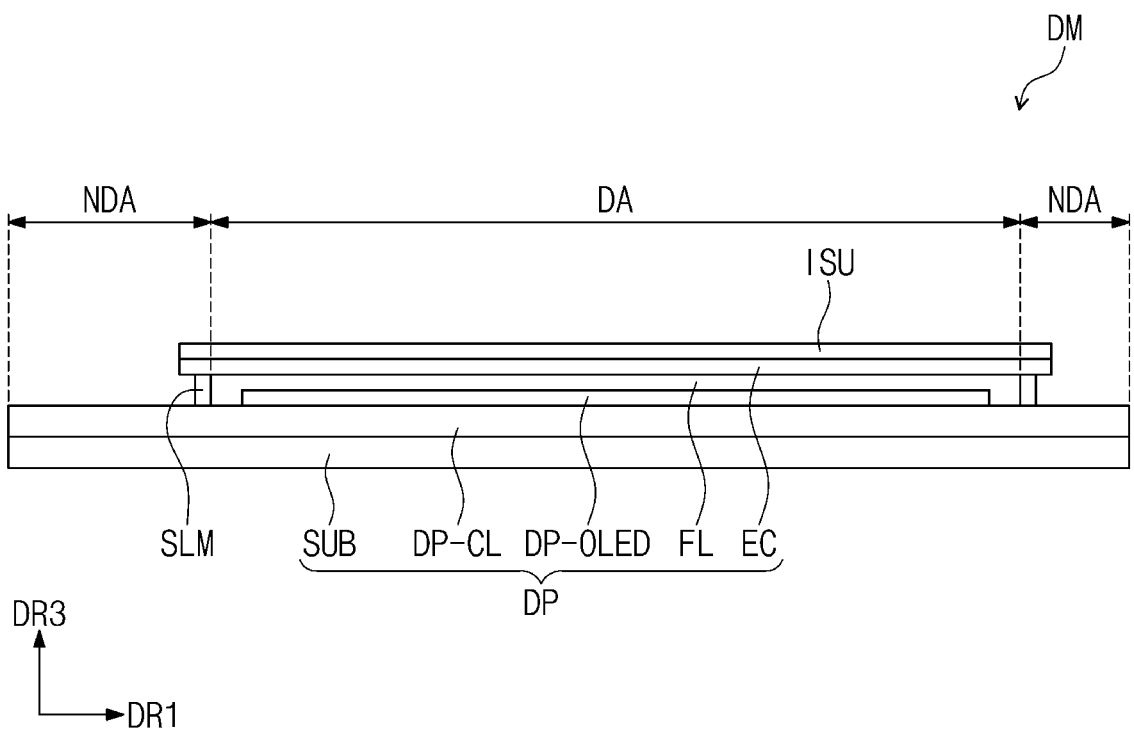
FIG. 2 is a cross-sectional view of a display panel according to some embodiments of the present disclosure.

FIG. 2 is a cross-sectional view of the display panel according to some embodiments of the present disclosure.

Referring to FIG. 2, the display panel DP includes a base substrate SUB, a circuit element layer DP-CL located on the base substrate SUB, a display element layer DP-OLED, and an encapsulation substrate EC. The first display substrate 100 in FIG. 1B may include the base substrate SUB, the circuit element layer DP-CL, and the display element layer DP-OLED. The second display substrate 200 may include the encapsulation substrate EC. The sealant SLM may be located between the first display substrate 100 and the second display substrate 200 to overlap the non-display area NDA.

The base substrate SUB may include at least one plastic film. The base substrate SUB that is a flexible substrate may include a plastic substrate, a glass substrate, a metal substrate, or an organic/inorganic composite substrate. The base substrate SUB may be a member supporting overall components of the display panel DP.

The circuit element layer DP-CL includes at least one intermediate insulation layer and a circuit element. The intermediate insulation layer includes at least one intermediate inorganic layer and at least one intermediate organic layer. The circuit element includes signal lines, a driving circuit of a pixel, etc.

The display element layer DP-OLED includes a plurality of organic light emitting diodes. The display element layer DP-OLED may further include an organic layer such as a pixel defining layer. According to other embodiments, when the display panel is a liquid crystal display panel, the display element layer may be a liquid crystal layer.

The encapsulation substrate EC seals the display element layer DP-OLED through the first display substrate 100 and the sealant SLM. A filling material (e.g., a predetermined filling material) FL may be located between the encapsulation substrate EC and the display element layer DP-OLED.

The encapsulation substrate EC protects the display element layer DP-OLED from foreign substances such as moisture, oxygen, and dust particles.

However, the present disclosure is not limited thereto. For example, a display panel according to other embodiments of the present disclosure may have a structure in which the encapsulation substrate EC and the sealant SLM are omitted. In this case, the encapsulation layer sealing the display element layer DP-OLED may be located on the first display substrate 100. Also, according to other embodiments, a display panel may have a structure including all of an encapsulation substrate and an encapsulation layer. According to some embodiments of the present disclosure, the display device DD may further include an input sensing layer ISU. The input sensing layer ISU may be located on the encapsulation substrate EC to sense an input applied from the outside. The input applied from the outside may be provided in various types. For example, the input applied from the outside includes various types of external inputs such as a portion of a user's body, a stylus pen, light, heat, or pressure. Also, in addition to a contact input generated by a portion of the user's body such as user's hands, a space touch (e.g., hovering) generated by being approached or adjacent may be one type of the inputs.

The input sensing layer ISU may be directly located on the display panel DP. In this specification, an expression "component A is located directly on component B" represents that an adhesive layer is not located between the component A and the component B. In some embodiments, the input sensing layer ISU may be manufactured in conjunction with the display panel DP by a continuous process. However, the present disclosure is not limited thereto. For example, the input sensing layer ISU may be provided as an individual panel, and may be coupled with the display panel DP through an adhesive layer.

Figure 3:
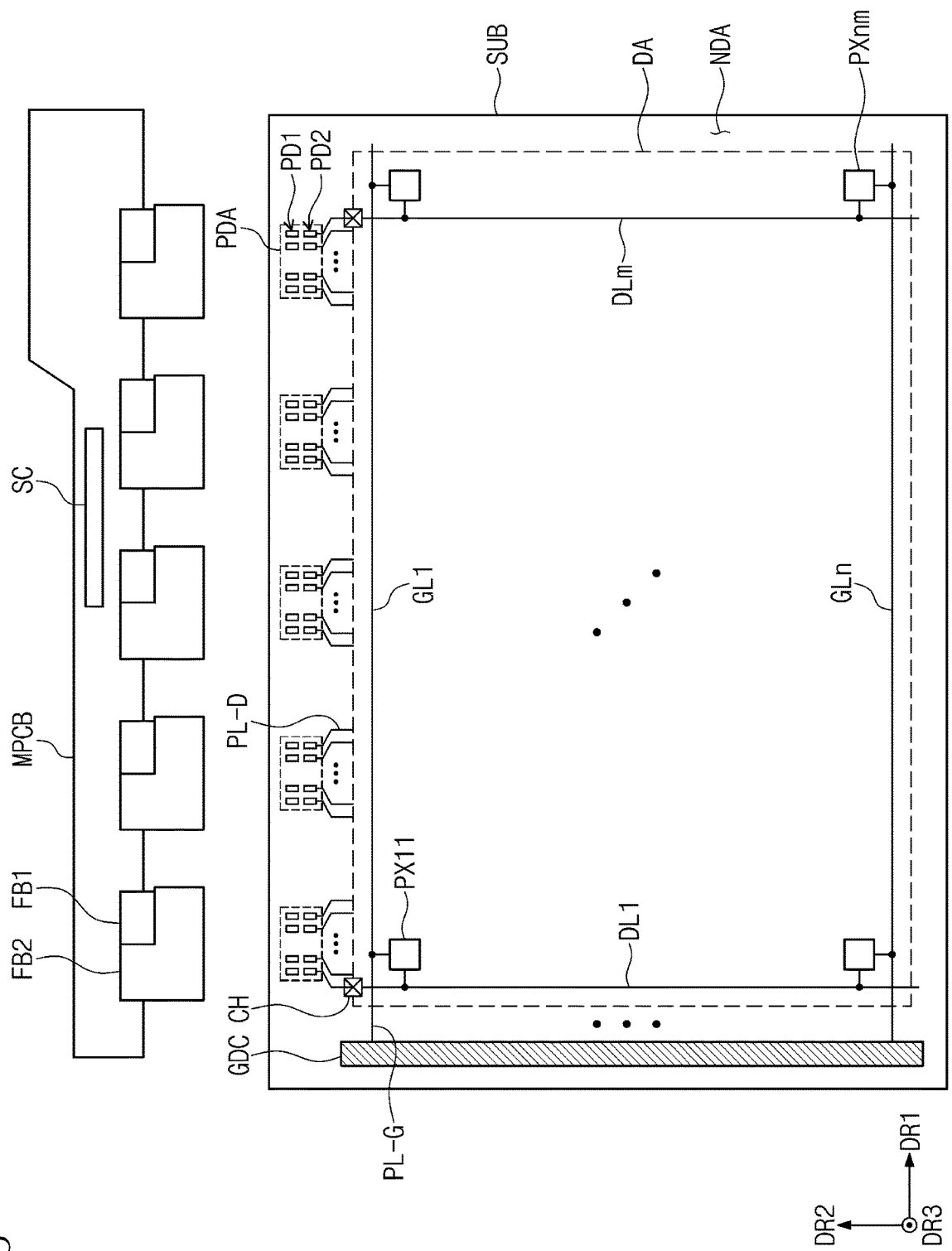
FIG. 3 is a plan view of the display device according to some embodiments of the present disclosure.

FIG. 3 is a plan view of the display device according to some embodiments of the present disclosure.

FIG. 3 is a view illustrating a planar arrangement relationship between signal lines GL1 to GLn, DL1 to DLm, PL-G, and PL-D and pixels PX11 to PXnm. The signal lines GL1 to GLn, DL1 to DLm, PL-G, and PL-D may include a plurality of gate lines GL1 to GLn, a plurality of data lines DL1 to DLm, and auxiliary signal lines PL-G and PL-D.

The plurality of gate lines GL1 to GLn each extend in the first direction DR1 and are arranged in the second direction DR2, and the plurality of data lines DL1 to DLm cross the plurality of gate lines GL1 to GLn, and are insulated therefrom. The plurality of gate lines GL1 to GLn and the plurality of data lines DL1 to DLm overlap the display area DA. The auxiliary signal lines PL-G and PL-D overlap the non-display area NDA and are connected to the plurality of gate lines GL1 to GLn and the plurality of data lines DL1 to DLm.

First auxiliary signal lines PL-G connected to the plurality of gate lines GL1 to GLn may be integrated with, and located on the same layer as, the plurality of gate lines GL1 to GLn. Although the plurality of gate lines GL1 to GLn and the first auxiliary signal lines PL-G are distinguished from each other in some embodiments, the gate line and the first auxiliary signal line, which are connected to each other, may be defined as one signal line. Here, the gate line and the first auxiliary signal line, which are connected to each other, may be defined as different portions of one signal line.

Second auxiliary signal lines PL-D connected to the data lines DL1 to DLm may be located on a different layer from the data lines DL1 to DLm. The data lines DL1 to DLm may be electrically connected to corresponding signal lines of the second auxiliary signal lines PL-D through a contact hole CH. The contact hole CH passes through at least one insulation layer located between the data lines DL1 to DLm and the second auxiliary signal lines PL-D. In FIG. 3, two contact holes CH are exemplarily illustrated.

In some embodiments of the present disclosure, the contact hole CH may be omitted. The data lines DL1 to DLm and the second auxiliary signal lines PL-D may be located on the same layer. Here, the data line and the second auxiliary signal line, which are connected to each other, among the data lines DL1 to DLm and the second auxiliary signal lines PL-D, may be defined as one signal line. Here, the data line and the second auxiliary signal line, which are connected to each other, may be defined as different portions of one signal line.

Each of the pixels PX11 to PXnm is connected to a corresponding gate line of the plurality of gate lines GL1 to GLn and to a corresponding data line of the plurality of data lines DL1 to DLm. Each of the pixels PX11 to PXnm may include a pixel driving circuit and a display element.

As illustrated in FIG. 3, pads PD1 and PD2 arranged in different rows are located on the pad areas PDA, respectively. The first pads PD1 arranged in the first row are arranged in the first direction DR1. The second pads PD2 arranged in the second row are arranged in the first direction DR1 and spaced apart from the first pads DP1 in the second direction DR2, which crosses the first direction.

As described above through FIG. 1A, the second pads PD2 arranged in the second row may be located closer to the display area DA than the first pads PD1 arranged in the first row, with respect to the second direction DR2. Each of the first pads PD1 and the second pad PD2 is connected to the second auxiliary signal lines PL-D.

The gate driving circuit GDC may be integrated to the display panel DP through an oxide silicon gate driver circuit (OSG) or amorphous silicon gate driver circuit (ASG) process. The first auxiliary signal lines PL-G receive a gate signal from the gate driving circuit GDC.

Figure 4:
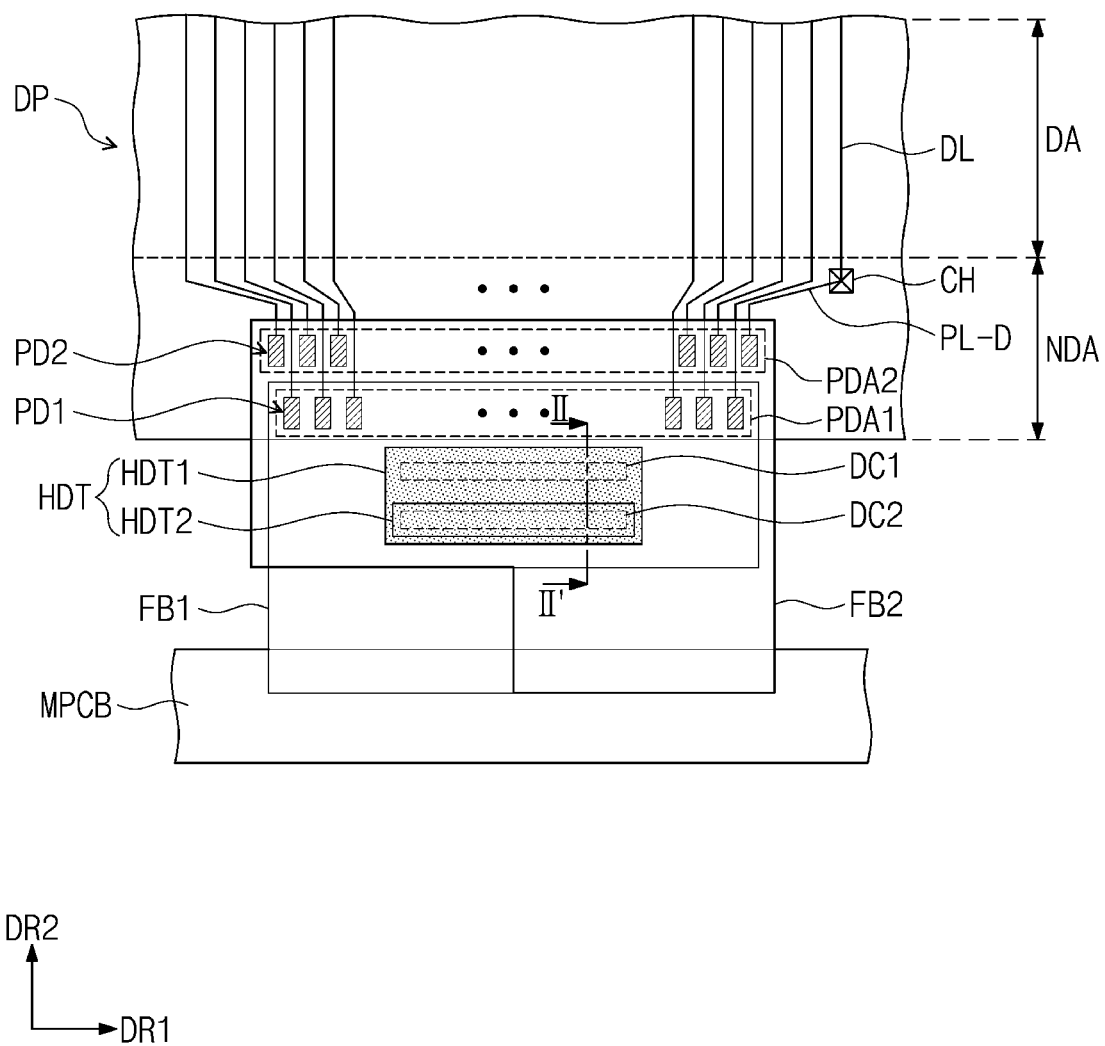
FIG. 4 is an enlarged plan view of the display device according to some embodiments of the present disclosure.

FIG. 4 is an enlarged plan view of the display device according to some embodiments of the present disclosure. FIG. 4 is an enlarged view illustrating one area of the display panel DP bonded to one first circuit board FB1 and one second circuit board FB2.

Referring to FIG. 4, the pad area PDA located on the non-display area NDA of the display panel DP includes a first pad area PDA1 on which the first pads PD1 are arranged, and a second pad area PDA2 on which the second pads PD2 are arranged.

The first circuit board FB1 has one end that is electrically bonded to the first pads PD1, and another end that is electrically bonded to the driving circuit board MPCB. The first pads PD1 may be respectively connected to corresponding data lines DL of the plurality of data lines DL. The first circuit board FB1 includes the first driving chip DC1 for transmitting first image signals to the first pads PD1.

The second circuit board FB2 may be located on the first circuit board FB1. The second circuit board FB2 has one end that is electrically bonded to the second pads PD2, and another end that is electrically bonded to the driving circuit board MPCB. The second pads PD2 may be respectively connected to corresponding data lines DL of the plurality of data lines DL. The second circuit board FB2 includes the second driving chip DC2 for transmitting second image signals to the second pads PD2.

Also, heat may be generated from the first driving chip DC1 and the second driving chip DC2 while the image signals are generated therethrough. The heat generated from each of the first driving chip DC1 and the second driving chip DC2 may cause an increase in overall temperature of the display panel DP.

According to some embodiments of the present disclosure, each of the first circuit board FB1 and the second circuit board FB2 may include a heat radiation member HDT for dissipating the heat generated from each of the first driving chip DC1 and the second driving chip DC2 to the outside. For example, the heat radiation member HDT contained in the first circuit board FB1 may entirely overlap the first driving chip DC1 and the second driving chip DC2. As a result, the heat radiation member HDT contained in the first circuit board FB1 may radiate the heat generated from each of the first driving chip DC1 and the second driving chip DC2. The heat radiation member HDT contained in the second circuit board FB2 may radiate the heat generated from the second driving chip DC2.

For example, the heat radiation member HDT includes a first heat radiation member HDT1 and a second heat radiation member HDT2. The heat generated from the first driving chip DC1 may be radiated through the first heat radiation member HDT1, and the heat generated from the second driving chip DC2 may be dissipated through the second heat radiation member HDT2. Thus, the temperature increase of the display panel DP by the heat generated from each of the first driving chip DC1 and the second driving chip DC2 may be prevented.

Figure 5A:
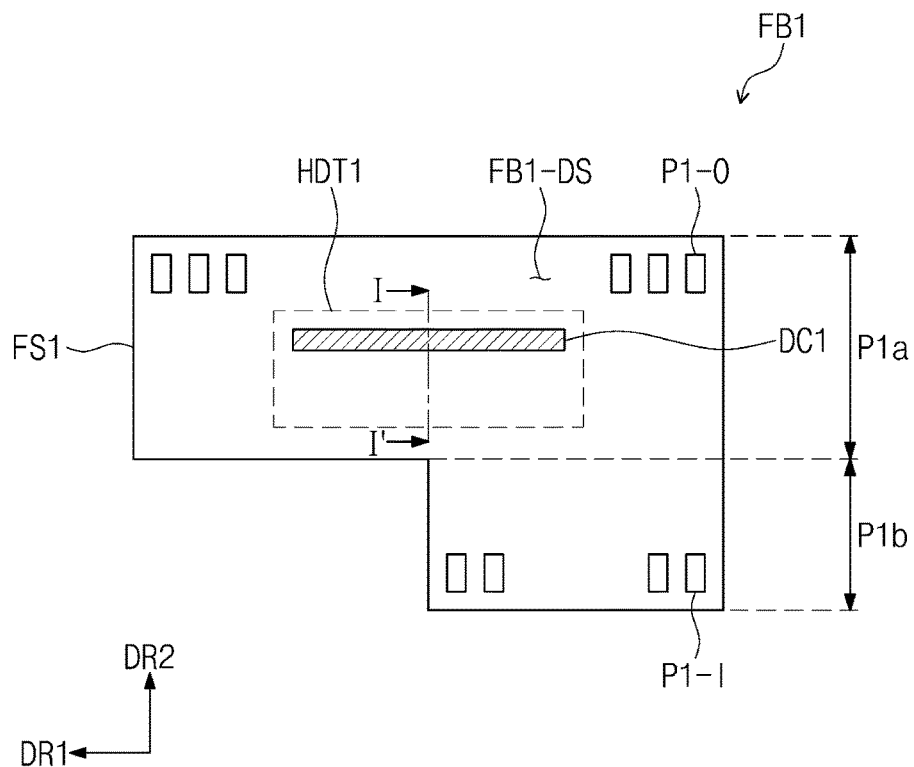
FIG. 5A is a plan view illustrating a bottom surface of a first circuit board according to some embodiments of the present disclosure.
Figure 5B:
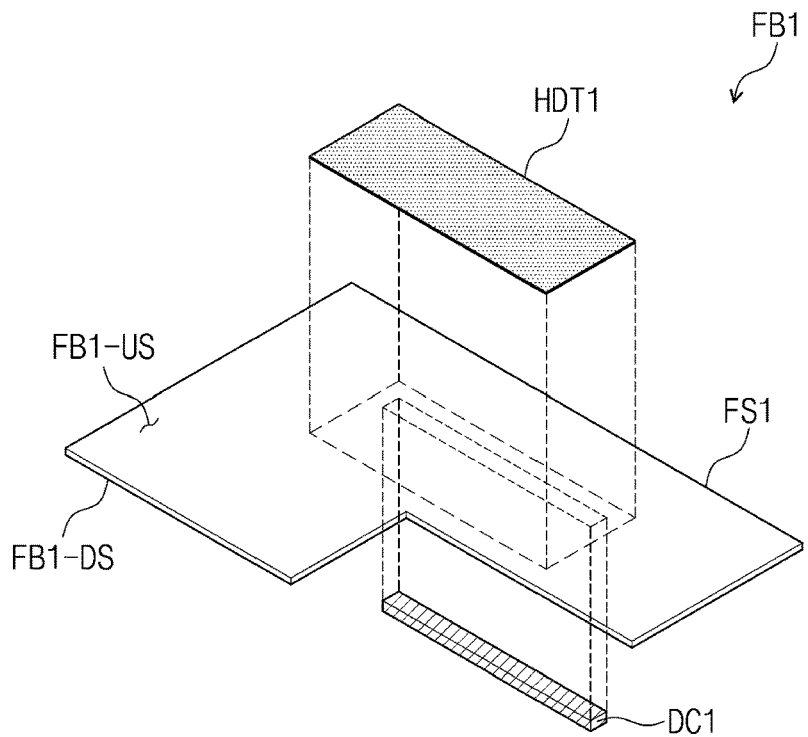
FIG. 5B is an exploded perspective view illustrating the first circuit board according to some embodiments of the present disclosure.
Figure 6:
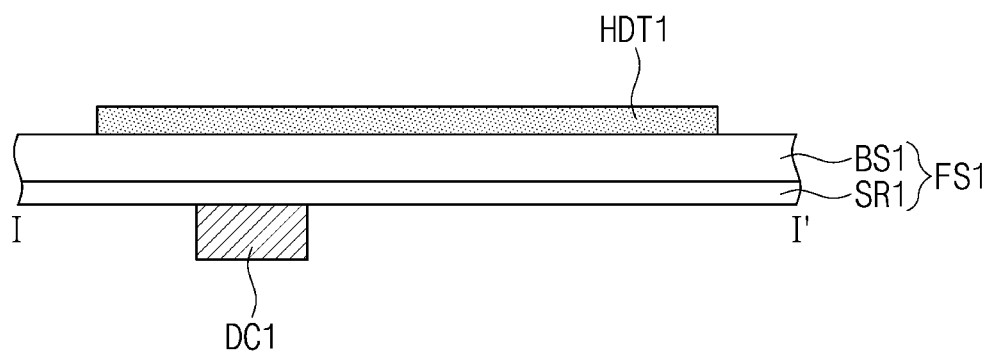
FIG. 6 is a cross-sectional view taken along the line I-I' of FIG. 5A according to some embodiments of the present disclosure.

FIG. 5A is a plan view illustrating a bottom surface of the first circuit board according to some embodiments of the present disclosure. FIG. 5B is an exploded perspective view illustrating the first circuit board according to some embodiments of the present disclosure. FIG. 6 is a cross-sectional view taken along the line I-I' of FIG. 5A according to some embodiments of the present disclosure.

The first circuit board FB1 may define a bottom surface FB1-DS and a top surface FB1-US. FIG. 5A is a plan view illustrating the bottom surface FB1-DS of the first circuit board FB1. In this specification, the bottom surface FB1-DS of the first circuit board FB1 faces the display panel DP, and the top surface FB1-US of the first circuit board FB1 may be opposite to the bottom surface FB1-DS.

Referring to FIG. 5A, the first circuit board FB1 includes a first substrate FS1, a first driving chip DC1, a plurality of first circuit pads P1-O and P1-I, and a first heat radiation member HDT1. The top surface FB1-US and the bottom surface FB1-DS of the first circuit board FB1 may be defined by the first substrate FS1.

According to some embodiments of the present disclosure, the first driving chip DC1 and the first circuit pads P1-O and P1-I may be spaced apart from each other, and may be located on the same layer as each other. The first heat radiation member HDT1 may be located on a layer that is different from the first driving chip DC1 and the first circuit pads P1-O and P1-I.

For example, as illustrated in FIG. 5B, the first driving chip DC1 and the first circuit pads P1-O and P1-I may be located on the bottom surface FB1-DS of the first circuit board FB1. The first heat radiation member HDT1 may entirely overlap the first driving chip DC1, and might not overlap the first circuit pads P1-O and P1-I. The first heat radiation member HDT1 may be located on the top surface FB1-US of the first circuit board FB1. Through this, heat generated from the first driving chip DC1 may be suitably transferred to the first heat radiation member HDT1, and the heat may be dissipated by the first heat radiation member HDT1.

According to some embodiments of the present disclosure, the first heat radiation member HDT1 may include a metal material having conductivity to dissipate the heat generated from the first driving chip DC1. For example, the first heat radiation member HDT1 may be made of copper, silver, and/or bronze, which are metal materials, or an alloy thereof.

Referring to FIG. 5A again, the first circuit pads P1-O and P1-I include first input pads P1-I and first output pads P1-O. The first driving chip DC1 may be located between the first input pads P1-I and the first output pads P1-O. In some embodiments, the first circuit board FB1 may further include signal lines that electrically connect the first input pads P1-I, the first output pads P1-O, and the first driving chip DC1.

Also, the first circuit board FB1 may define a first output area P1a on which the first output pads P1-O and the first driving chip DC1 are located, and a first input area P1b on which the first input pads P1-I is located. In this case, the first output area P1a may have a planar area that is greater than that of the first input area P1b.

The first output pads P1-O may be electrically bonded to the first pads PD1 of the first row located on the display panel DP, respectively, and electrically connected to the first driving chip DC1. The first input pads P1-I may be respectively electrically bonded to driving pads located on the driving circuit board MPCB and electrically connected to the first driving chip DC1.

Also, at least one first input pad of the first input pads P1-I may be directly connected to one corresponding first output pad of the first output pads P1-O instead of being connected to the first driving chip DC1. For example, a control signal transmitted to the first input pad P1-I may be transmitted to the first output pad P1-O. The control signal that is a signal for controlling an operation of the gate driving circuit GDC in FIG. 3 may be transmitted from the driving circuit board MPCB.

Referring to FIG. 6, the first substrate FS1 may have a flexible property. The first substrate FS1 includes a first base layer BS1, and a first insulation layer SR1 located on the first base layer BS1. For example, the first insulation layer SR1 may be a solder resist.

The first input pads P1-I and the first output pads P1-O in FIG. 5A may be located on a bottom surface of the first base layer BS1. The first insulation layer SR1 may be located on the bottom surface of the first base layer BS1 while entirely covering signal lines that electrically connect the first input pads P1-I, the first output pads P1-O, and the first driving chip DC1.

According to some embodiments of the present disclosure, the first input pads P1-I, the first output pads P1-O, and the first driving chip DC1 may be exposed by the first insulation layer SR1. Through this, the first input pads P1-I may be bonded to the driving pads of the driving circuit board MPCB, and the first output pads P1-O may be bonded to the first pads PD1 of the display panel DP.

The first driving chip DC1 may be located on the first insulation layer SR1 and exposed to the outside. However, the present disclosure is not limited thereto. For example, the first driving chip DC1 may be located on the bottom surface of the first base layer BS1 and exposed by the first insulation layer SR1. The first heat radiation member HDT1 may be located on a top surface of the first base layer BS1, which is opposite to the bottom surface, and entirely overlap the first driving chip DC1 on a plane.

Figure 7A:
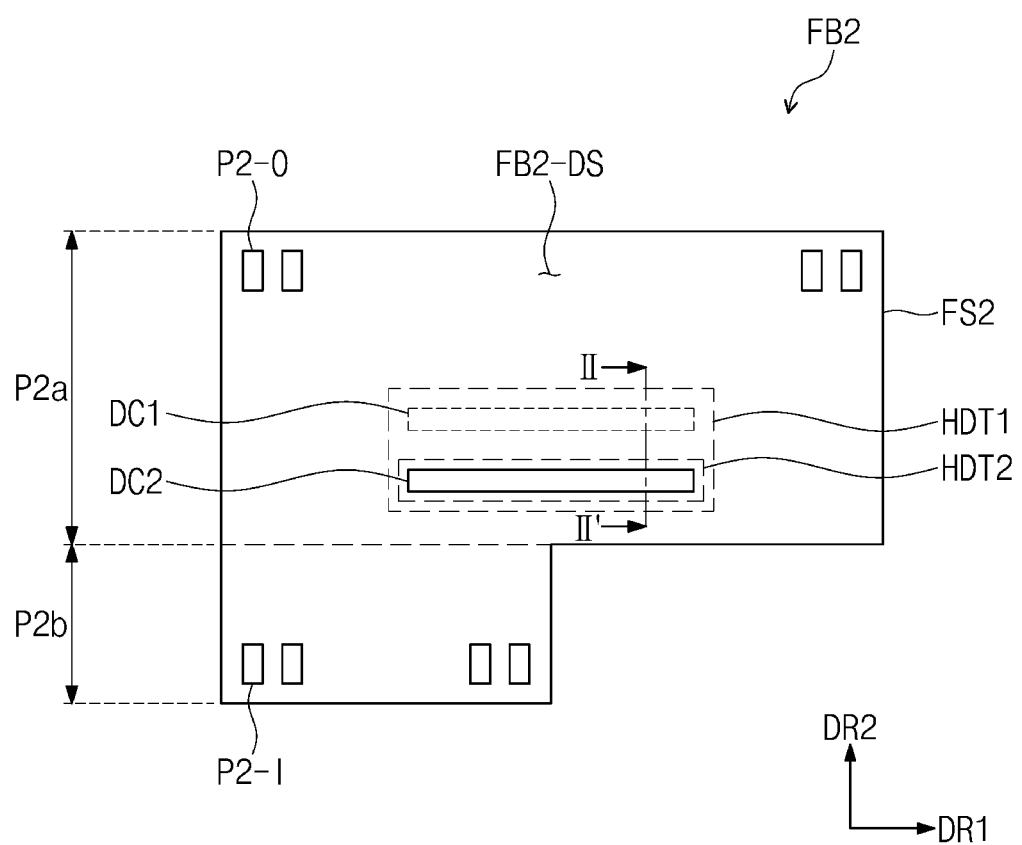
FIG. 7A is a plan view illustrating a bottom surface of a second circuit board according to some embodiments of the present disclosure.
Figure 7B:
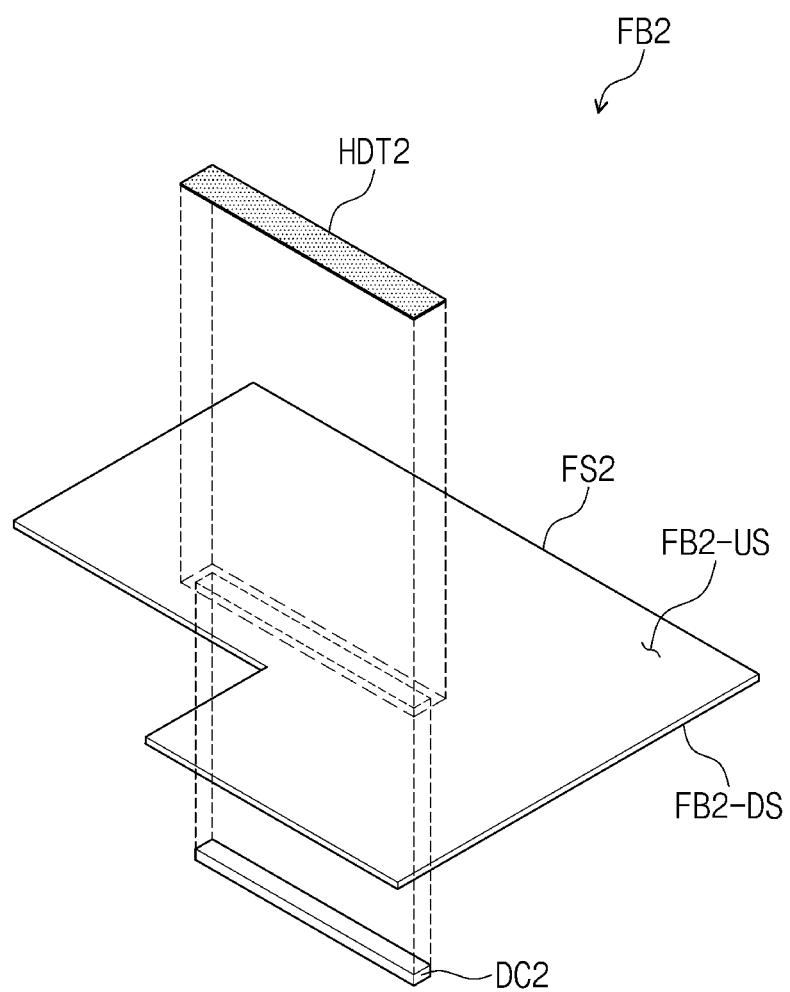
FIG. 7B is an exploded perspective view illustrating the second circuit board according to some embodiments of the present disclosure.
Figure 8:
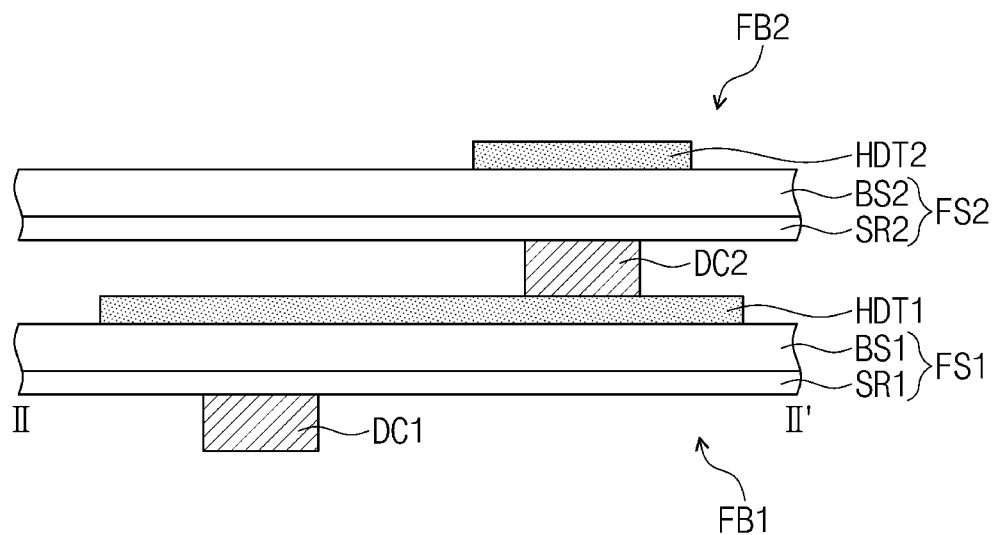
FIG. 8 is a cross-sectional view taken along the line II-II' of FIG. 7A according to some embodiments of the present disclosure.

FIG. 7A is a plan view illustrating a bottom surface of the second circuit board according to some embodiments of the present disclosure. FIG. 7B is an exploded perspective view illustrating the second circuit board according to some embodiments of the present disclosure. FIG. 8 is a cross-sectional view taken along the line II-II' of FIG. 7A according to some embodiments of the present disclosure.

The second circuit board FB2 may define a bottom surface FB2-DS and a top surface FB2-US. FIG. 7A is a plan view illustrating the bottom surface FB2-DS of the second circuit board FB2. In this specification, the bottom surface FB2-DS of the second circuit board FB2 faces the display panel DP, and the top surface FB2-US of the second circuit board FB2 may be opposite to the bottom surface FB2-DS.

Referring to FIG. 7A, the second circuit board FB2 includes a second substrate FS2, a second driving chip DC2, a plurality of second circuit pads P2-O and P2-I, and a second heat radiation member HDT2. The top surface FB2-US and the bottom surface FB2-DS of the second circuit board FB2 may be defined by the second substrate FS2.

The second driving chip DC2 and the second circuit pads P2-O and P2-I may be located on the same layer as each other. The second heat radiation member HDT2 may be located on a layer that is different from the second driving chip DC2 and the second circuit pads P2-O and P2-I.

For example, as illustrated in FIG. 7B, the second driving chip DC2 and the second circuit pads P2-O and P2-I may be located on the bottom surface FB2-DS of the second circuit board FB2. The bottom surface FB2-DS of the second circuit board FB2 may face the top surface FB1-US of the first circuit board FB1.

The second heat radiation member HDT2 may entirely overlap the second driving chip DC2, and might not overlap the second circuit pads P2-O and P2-I. The second heat radiation member HDT2 may be located on the top surface FB2-US of the second circuit board FB2. Through this, heat generated from the second driving chip DC2 may be suitably transferred to the second heat radiation member HDT2, and the heat may be dissipated by the second heat radiation member HDT2.

According to some embodiments of the present disclosure, the second heat radiation member HDT2 may include a metal material having conductivity to dissipate the heat generated from the second driving chip DC2. For example, the second heat radiation member HDT2 may be made of copper, silver, and/or bronze, which are metal materials, or an alloy thereof.

Referring to FIG. 7A again, the second circuit pads P2-O and P2-I include second input pads P2-I and second output pads P2-O. The second driving chip DC2 may be located between the second input pads P2-I and the second output pads P2-O. On a plane, the second driving chip DC2 may be spaced apart from the first driving chip DC1. In some embodiments, the second circuit board FB2 may further include signal lines that electrically connect the second input pads P2-I, the second output pads P2-O, and the second driving chip DC2.

Also, the second circuit board FB2 may define a second output area P2a on which the second output pads P2-O and the second driving chip DC2 are located, and a second input area P2b on which the second input pads P2-I are located. In this case, the second output area P2a may have a planar area that is greater than that of the second input area P2b.

According to some embodiments of the present disclosure, the second circuit board FB2 corresponding to the second output area P2a may be located on the first circuit board FB1 corresponding to the first output area P1a and exposing the first output pads P1-O in FIG. 5A. That is, the first driving chip DC1, the second driving chip DC2, the first heat radiation member HDT1, and the second heat radiation member HDT2 may be located on an area in which the first output area P1a and the second output area P2a overlap each other.

The second output pads P2-O may be respectively electrically bonded to the second pads PD2 of the second row located on the display panel DP, and electrically connected to the second driving chip DC2. The second input pads P2-I may be respectively electrically bonded to the driving pads located on the driving circuit board MPCB, and electrically connected to the second driving chip DC2.

Likewise, at least one second input pad of the second input pads P2-I may be directly connected to one corresponding second output pad of the second output pads P2-O instead of being connected to the second driving chip DC2.

Referring to FIG. 8, the second substrate FS2 may have a flexible property. The second substrate FS2 includes a second base layer BS2 and a second insulation layer SR2 located on the second base layer BS2. For example, the second insulation layer SR2 may be a solder resist.

The second input pads P2-I and the second output pads P2-O illustrated previously in FIG. 7A may be located on a bottom surface of the second base layer BS2. The second insulation layer SR2 may be located on the bottom surface of the second base layer BS2 while entirely covering signal lines that electrically connect the second input pads P2-I, the second output pads P2-O, and the second driving chip DC2.

According to some embodiments of the present disclosure, the second input pads P2-I, the second output pads P2-O, and the second driving chip DC2 may be exposed by the second insulation layer SR2. Through this, the second input pads P2-I may be bonded to the driving pads of the driving circuit board MPCB, and the second output pads P2-O may be bonded to the second pads PD2 of the display panel DP.

The second driving chip DC2 may be located on the second insulation layer SR2 and exposed to the outside. However, the present disclosure is not limited thereto. For example, in a manner similar to the first driving chip DC1, the second driving chip DC2 may be located on the bottom surface of the second base layer BS2 and exposed by the second insulation layer SR2.

According to some embodiments of the present disclosure, the second heat radiation member HDT2 may be located on a top surface of the second base layer BS2, which is opposite to the bottom surface, and may entirely overlap the second driving chip DC2 on a plane/in a plan view. Also, the second heat radiation member HDT2 may entirely overlap the first heat radiation member HDT1. In this case, the first heat radiation member HDT1 may have a planar area that is greater than that of the second heat radiation member HDT2.

As illustrated in FIG. 8, the first heat radiation member HDT1 may entirely overlap each of the first driving chip DC1 and the second driving chip DC2, and the second heat radiation member HDT2 might not overlap the first driving chip DC1 and may overlap the second driving chip DC2. For example, the second driving chip DC2 according to some embodiments of the present disclosure may be located between the first heat radiation member HDT1 and the second heat radiation member HDT2.

For example, the second driving chip DC2 may contact the first heat radiation member HDT1. For another example, unlike as illustrated in FIG. 8, the second driving chip DC2 may directly face the first heat radiation member HDT1 and be spaced (e.g., by a predetermined distance) from the first heat radiation member HDT1.

As described above, the heat generated from the second driving chip DC2 may be dissipated through each of the first heat radiation member HDT1 and the second heat radiation member HDT2. As a result, a heat radiation efficiency of the heat generated from the second driving chip DC2 may further improve.

Also, in this specification, although the first circuit board FB1 and the second circuit board FB2, each of which has a planar shape, are illustrated, the first circuit board FB1 and the second circuit board FB2, which are in a state after being bonded to the display panel DP and the driving circuit board MPCB, may have a bent shape. Also, although the second circuit board FB2 includes the second heat radiation member HDT2, the present disclosure is not limited thereto. For example, the second heat radiation member HDT2 may be omitted. In this case, the heat generated from each of the first driving chip DC1 and the second driving chip DC2 may be dissipated through the first heat radiation member HDT1.

Figure 9:
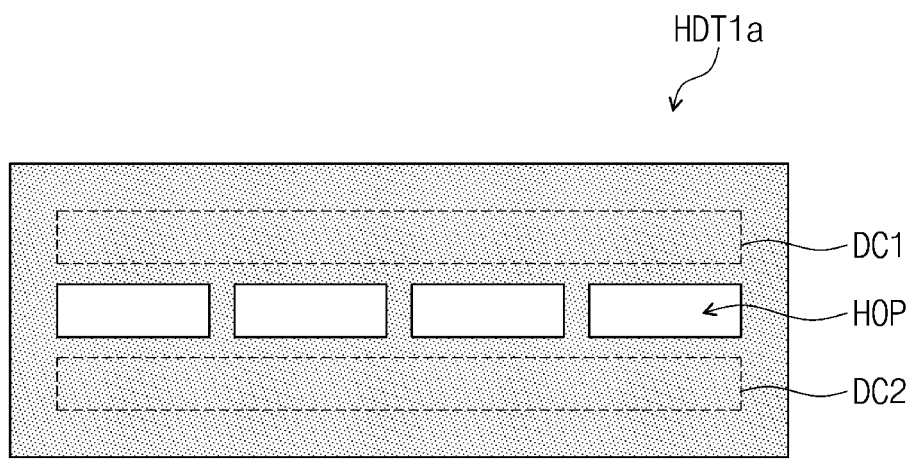
FIGS. 9 to 10 are plan views illustrating a first heat radiation member according to other embodiments of the present disclosure.
Figure 9:
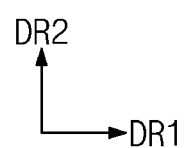
Figure 10:
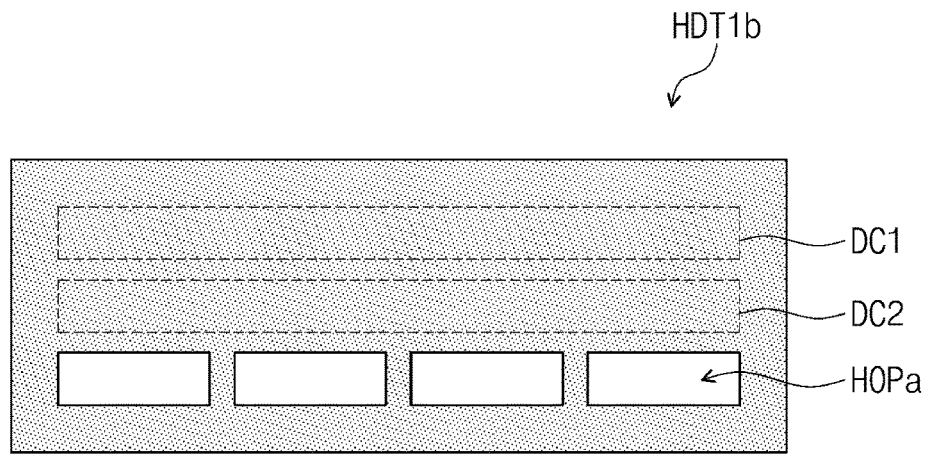
Figure 10:
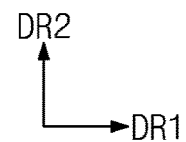
Figure 11:
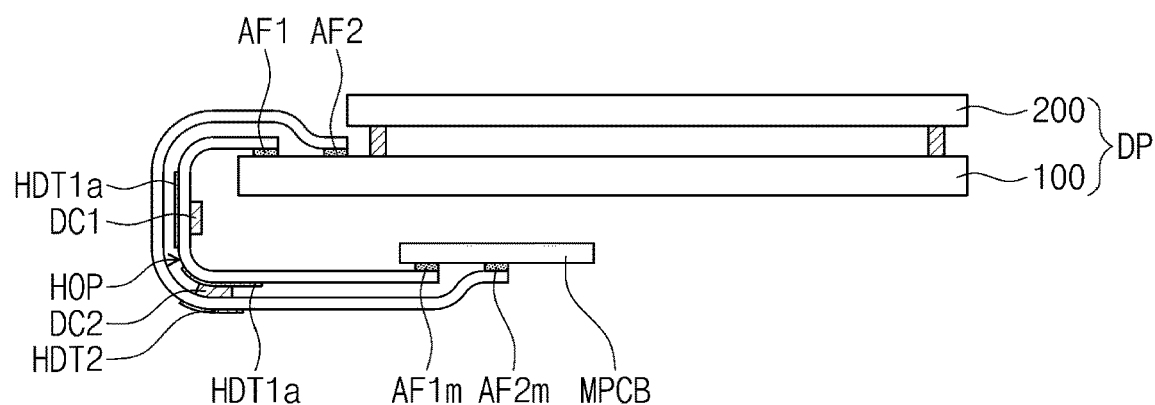
FIG. 11 is a cross-sectional view of a display device including the first heat radiation member in FIG. 9 according to other embodiments of the present disclosure.
Figure 11:
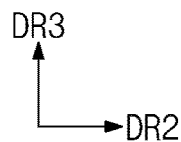

FIGS. 9 to 10 are plan views of a first heat radiation member according to other embodiments of the present disclosure. FIG. 11 is a cross-sectional view of a display device including the first heat radiation member in FIG. 9 according to other embodiments of the present disclosure.

Referring to FIG. 9, a first heat radiation member HDT1a may define at least one opening HOP. For example, in this specification, the opening HOP may be provided in plurality, and the plurality of openings HOP might not overlap the first driving chip DC1 and the second driving chip DC2, and may be arranged in the first direction DR1.

According to some embodiments, the opening HOP may be located between the first driving chip DC1 and the second driving chip DC2 on a plane. The first heat radiation member HDT1a may be bent with respect to the first direction DR1 in an area in which the opening HOP is defined.

However, the present disclosure is not limited to the arrangement structure of the opening HOP defined in the first heat radiation member HDT1a. For example, an opening HOPa defined in a first heat radiation member HDT1b in FIG. 10 may be located below a second driving chip DC2 instead of being located between a first driving chip DC1 and the second driving chip DC2.

Referring to FIG. 11, each of a first circuit board FB1 and a second circuit board FB2 may be bent from one end of a display panel DP. For example, each of the first circuit board FB1 and the second circuit board FB2 may include one end facing a top surface of the display panel DP, and another end facing a bottom surface of the display panel DP. Here, the top surface and the bottom surface of the display panel DP may represent a top surface and a bottom surface of a first display substrate 100.

As illustrated in FIG. 11, the first heat radiation member HDT1a may be further easily bent with respect to the first direction DR1 through the opening HOP defined in the first heat radiation member HDT1a.

Also, the first circuit board FB1 may be electrically bonded on the display panel and the driving circuit board MPCB through first conductive adhesive members AF1 and AF1m, respectively. The second circuit board FB2 may be electrically bonded on the display panel and the driving circuit board MPCB through second conductive adhesive members AF2 and AF2m, respectively.

According to some embodiments of the present disclosure, the display device includes the first circuit board and the second circuit board of two different types overlapping each other. For example, the display device includes the first heat radiation member capable of dissipating the heat generated from each of the first driving chip of the first circuit board and the second driving chip of the second circuit board.

Also, the display device may further include the second heat radiation member to dissipate the heat generated from the second driving chip through each of the first heat radiation member and the second heat radiation member. As a result, the heat radiation efficiency of the heat generated from the second driving chip may further improve.

As described above, according to some embodiments of the present disclosure, the first heat radiation member may dissipate the heat generated from each of the first driving chip and the second driving chip, and the second heat radiation member may additionally dissipate the heat of the second driving chip. As a result, the internal temperature increase of the display panel caused by the first driving chip and the second driving chip may be reduced or prevented.

The present disclosure has been particularly shown and described with reference to embodiments thereof. While specific terms were used, they were not used to limit the meaning or the scope of the present invention described in claims, but merely used to explain the present disclosure. Accordingly, a person having ordinary skill in the art will understand from the above that various modifications and other equivalent embodiments are also possible. Hence, the real protective scope of the present disclosure shall be determined by the technical scope of the accompanying claims, with functional equivalents thereof to be included therein.

What is claimed is:

1. A display device comprising:
 a display panel comprising a plurality of first pads, and a plurality of second pads spaced apart from the first pads;
 a first circuit board comprising first circuit pads respectively bonded to the first pads, a first driving chip electrically connected to the first circuit pads, and a first heat radiation member; and
 a second circuit board comprising second circuit pads respectively bonded to the second pads, and a second driving chip electrically connected to the second circuit pads,
 wherein the first heat radiation member overlaps the first driving chip and the second driving chip.

2. The display device of claim 1, wherein the first driving chip and the first heat radiation member are on different layers, and
 wherein the second driving chip directly faces the first heat radiation member.

3. The display device of claim 1, wherein the first heat radiation member entirely overlaps the first driving chip and the second driving chip in a plan view, and
 wherein the second driving chip contacts the first heat radiation member.

4. The display device of claim 1, wherein the second circuit board further comprises a second heat radiation member at a layer that is different from the second driving chip, and entirely overlapping the second driving chip.

5. The display device of claim 4, wherein the second driving chip is between the first heat radiation member and the second heat radiation member.

6. The display device of claim 4, wherein the first heat radiation member has a planar area that is greater than that of the second heat radiation member, and
 wherein the second heat radiation member entirely overlaps the first heat radiation member.

7. The display device of claim 1, wherein the first circuit board further comprises a first substrate having a first bottom surface facing the display panel, and a first top surface opposite to the first bottom surface,
 wherein the first circuit pads and the first driving chip are on the first bottom surface, and
 wherein the first heat radiation member is on the first top surface.

8. The display device of claim 7, wherein the second circuit board further comprises a second substrate having a second bottom surface facing the first circuit board, and a second top surface opposite to the second bottom surface, and
 wherein the second circuit pads and the second driving chip are on the second bottom surface.

9. The display device of claim 8, wherein the second circuit board further comprises a second heat radiation member that overlaps the second driving chip, and that is on the second top surface, and
 wherein the second driving chip is between the first heat radiation member and the second heat radiation member.

10. The display device of claim 1, wherein the first heat radiation member defines at least one opening that does not overlap the first driving chip or the second driving chip.

11. The display device of claim 10, wherein the first driving chip is spaced apart from the second driving chip in one direction in a plan view,
 wherein the at least one opening is of a plurality of openings that are arranged in a different direction that is perpendicular to the one direction, and
 wherein the first heat radiation member is bent with respect to the different direction in an area in which the openings are defined.

12. The display device of claim 10, wherein the opening is defined between the first driving chip and the second driving chip in a plan view.

13. The display device of claim 1, wherein the first pads are arranged in a first row, and
 wherein the second pads are arranged in a second row spaced apart from the first row in one direction.

14. The display device of claim 1, wherein the first circuit board and the second circuit board are bent from one end of the display panel, and
 wherein the first circuit board and the second circuit board have one end facing a top surface of the display panel, on which the first pads and the second pads are located, and another end facing a bottom surface of the display panel, which is opposite to the top surface.

15. The display device of claim 1, wherein the first heat radiation member does not overlap the first circuit pads or the second circuit pads.

16. A display device comprising:
 a display panel;
 a first circuit board comprising a first base layer having a first bottom surface and a first top surface, a first driving chip that is electrically connected to the display panel and is on the first bottom surface, and a first heat radiation member that entirely overlaps the first driving chip and is on the first top surface; and
 a second circuit board comprising a second base layer having a second top surface and a second bottom surface that faces the first heat radiation member, a second driving chip that is electrically connected to the display panel and is between the first heat radiation member and the second bottom surface, and a second heat radiation member that entirely overlaps the second driving chip and is on the second top surface.

17. The display device of claim 16, wherein the first heat radiation member has a planar area that is greater than that of the second heat radiation member, and
wherein the first driving chip, the second driving chip, and the second heat radiation member entirely overlap the first heat radiation member.

18. The display device of claim 16, wherein the first circuit board is defined by a first portion facing a top surface of the display panel, a second portion facing a bottom surface of the display panel, and a third portion between the first portion and the second portion, and
wherein the first heat radiation member and the first driving chip overlap the third portion.

19. The display device of claim 16, wherein the second heat radiation member does not overlap the first driving chip.

20. A display device comprising:
a display panel;
a first circuit board comprising a first driving chip, and a heat radiation member that entirely overlaps the first driving chip; and
a second circuit board on the first circuit board to cover the first driving chip and the heat radiation member, and comprising a second driving chip,
wherein the heat radiation member is between the first driving chip and the second driving chip, and entirely overlaps the first driving chip and the second driving chip.

* * * * *